(12) United States Patent
Chang et al.

(10) Patent No.: US 9,773,902 B2
(45) Date of Patent: Sep. 26, 2017

(54) TRENCH-GATE SEMICONDUCTOR DEVICE AND METHOD FOR FORMING THE SAME

(71) Applicant: Vanguard International Semiconductor Corporation, Hsinchu (TW)

(72) Inventors: Jui-Chun Chang, Hsinchu (TW); Hsiung-Shih Chang, Taichung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 15 days.

(21) Appl. No.: 14/089,211

(22) Filed: Nov. 25, 2013

(65) Prior Publication Data

US 2015/0145026 A1 May 28, 2015

(51) Int. Cl.
*H01L 29/78* (2006.01)
*H01L 29/423* (2006.01)
*H01L 29/66* (2006.01)
*H01L 21/762* (2006.01)
*H01L 29/08* (2006.01)
*H01L 29/40* (2006.01)
*H01L 29/06* (2006.01)

(52) U.S. Cl.
CPC .... *H01L 29/7835* (2013.01); *H01L 21/76202* (2013.01); *H01L 29/0847* (2013.01); *H01L 29/4236* (2013.01); *H01L 29/66659* (2013.01); *H01L 29/0653* (2013.01); *H01L 29/402* (2013.01)

(58) Field of Classification Search
CPC .......... H01L 29/66734; H01L 29/7813; H01L 29/7835; H01L 29/404; H01L 29/407; H01L 29/4236; H01L 29/7825
See application file for complete search history.

(56) References Cited

U.S. PATENT DOCUMENTS

| | | | | |
|---|---|---|---|---|
| 6,198,130 | B1 * | 3/2001 | Nobuto | H01L 29/7394 257/331 |
| 7,888,732 | B2 * | 2/2011 | Denison | H01L 29/0653 257/328 |
| 9,048,312 | B2 * | 6/2015 | Chang | H01L 29/7813 |
| 2006/0006386 | A1 * | 1/2006 | Hirler et al. | 257/60 |
| 2006/0118862 | A1 * | 6/2006 | Hirler | H01L 29/1045 257/330 |

(Continued)

FOREIGN PATENT DOCUMENTS

CN 101355104 A 1/2009

*Primary Examiner* — Stephen Bradley
(74) *Attorney, Agent, or Firm* — Birch, Stewart, Kolasch & Birch, LLP

(57) ABSTRACT

A semiconductor device including a substrate having an active region and a field-plate region therein is disclosed. At least one trench-gate structure is in the substrate. The field-plate region is at a first side of the trench-gate structure. At least one source doped region is in the substrate at a second side opposite to the first side of the trench-gate structure. The source doped region adjoins the sidewall of the trench-gate structure. A drain doped region is in the substrate corresponding to the active region. The field-plate region is between the drain doped region and the trench-gate structure. An extending direction of length of the trench-gate structure is perpendicular to that of the drain doped region as viewed from a top-view perspective.

25 Claims, 9 Drawing Sheets

(56) References Cited

U.S. PATENT DOCUMENTS

| | | | |
|---|---|---|---|
| 2007/0278568 A1* | 12/2007 | Williams | H01L 21/761 257/335 |
| 2010/0200915 A1* | 8/2010 | Denison | H01L 29/42368 257/335 |
| 2011/0133269 A1 | 6/2011 | Yamaji | |
| 2012/0280307 A1* | 11/2012 | Su | H01L 29/872 257/328 |
| 2015/0076590 A1* | 3/2015 | Meiser et al. | 257/330 |

\* cited by examiner

TRENCH-GATE SEMICONDUCTOR DEVICE AND METHOD FOR FORMING THE SAME

BACKGROUND OF THE INVENTION

Field of the Invention

The present invention relates to a semiconductor device, and in particular, to a semiconductor device having a trench-gate and a method for forming the same.

Description of the Related Art

Technology that includes high-voltage elements is implemented to integrated circuits with high voltages and high power. In order to achieve high-withstand voltage and high current, the flow of the driving current in a conventional power transistor is developed from a horizontal direction to a vertical direction. A metal oxide semiconductor field-effect transistor (MOSFET) having a trench-gate has been developed that is capable of effectively reducing on-resistance (Ron) and processing high currents.

FIG. 1 is a top-view of a metal oxide semiconductor field-effect transistor having a trench-gate. The metal oxide semiconductor field-effect transistor comprises a substrate 500. A drain doped region 510, a trench-gate structure 520 and source doped regions 530 are in the substrate 500. The source doped regions 530 are at two sides of the trench-gate structure 520. The source doped regions 530 and the trench-gate structure 520 have the same length, but the trench-gate structure 520 has a depth that is greater than that of the source doped regions 530. An extending direction of lengths of the source doped regions 530 and the trench-gate structure 520 is parallel to that of the drain doped region 510 as viewed from a top-view perspective. The driving current of the metal oxide semiconductor field-effect transistor flows from the drain doped region 510 towards the source doped regions 530 and the trench-gate structure 520, and further flows up to the source doped regions 530 along the sidewall of the trench-gate structure 520. Accordingly, the gate channel width w of the metal oxide semiconductor field-effect transistor is the length of the trench-gate structure 520.

When the gate channel length is fixed, the amount of driving current is proportional to the above-mentioned gate channel width. However, if the gate channel width is increased, the length of the trench-gate structure 520 is also increased, thereby increasing the size of the semiconductor device.

Thus, there exists a need in the art for development of a semiconductor device having a trench-gate and a method for forming the same capable of mitigating or eliminating the aforementioned problems.

BRIEF SUMMARY OF INVENTION

A detailed description is given in the following embodiments with reference to the accompanying drawings. A semiconductor device and method for forming the same are provided.

An exemplary embodiment of a semiconductor device according to the invention is provided. The semiconductor device comprises a substrate having an active region and a field-plate region in the active region. At least one trench-gate structure is in the substrate. The field-plate region is at a first side of the trench-gate structure(s). At least one source doped region is in the substrate at a second side opposite to the first side of the trench-gate structure(s). The source doped region(s) adjoins the sidewall of the trench-gate structure. A drain doped region is in the substrate corresponding to the active region. The field-plate region is between the drain doped region and the trench-gate structure(s). An extending direction of length of the trench-gate structure(s) is perpendicular to that of the drain doped region as viewed from a top-view perspective.

An exemplary embodiment of a method for forming a semiconductor device according to the invention is provided. The method for forming a semiconductor device comprises providing a substrate having an active region and a field-plate region in the active region. At least one trench-gate structure is formed in the substrate, wherein the field-plate region is at a first side of the trench-gate structure(s). At least one source doped region is formed in the substrate at a second side opposite to the first side of the trench-gate structure(s), wherein the source doped region(s) adjoins the sidewall of the trench-gate structure(s). A drain doped region is formed in the substrate corresponding to the active region, wherein the field-plate region is between the drain doped region and the trench-gate structure(s), and wherein an extending direction of a length of the trench-gate structure(s) is perpendicular to that of the drain doped region as viewed from a top-view perspective.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
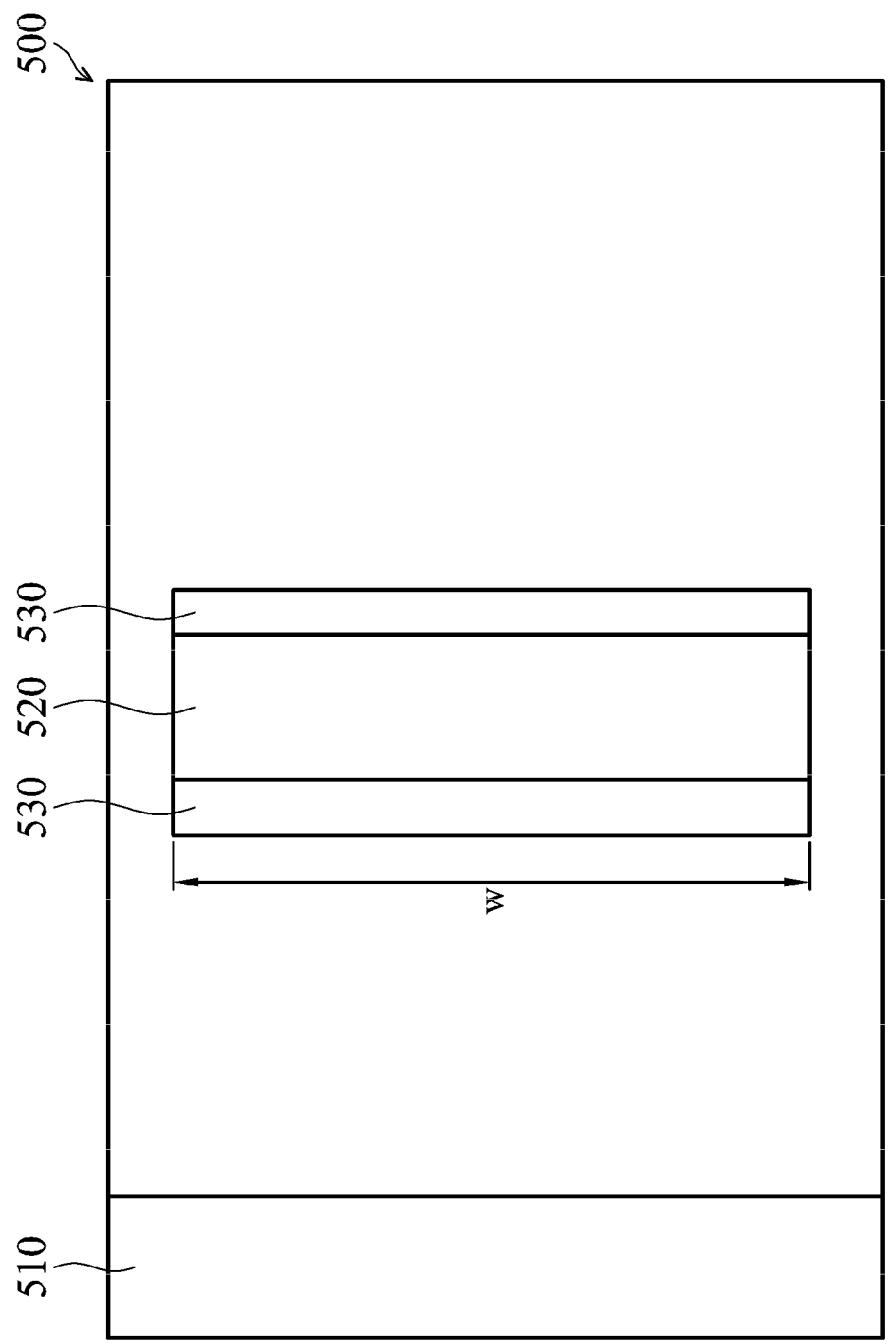
FIG. 1 is a top-view of a metal oxide semiconductor field-effect transistor having a trench-gate.

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 4A:
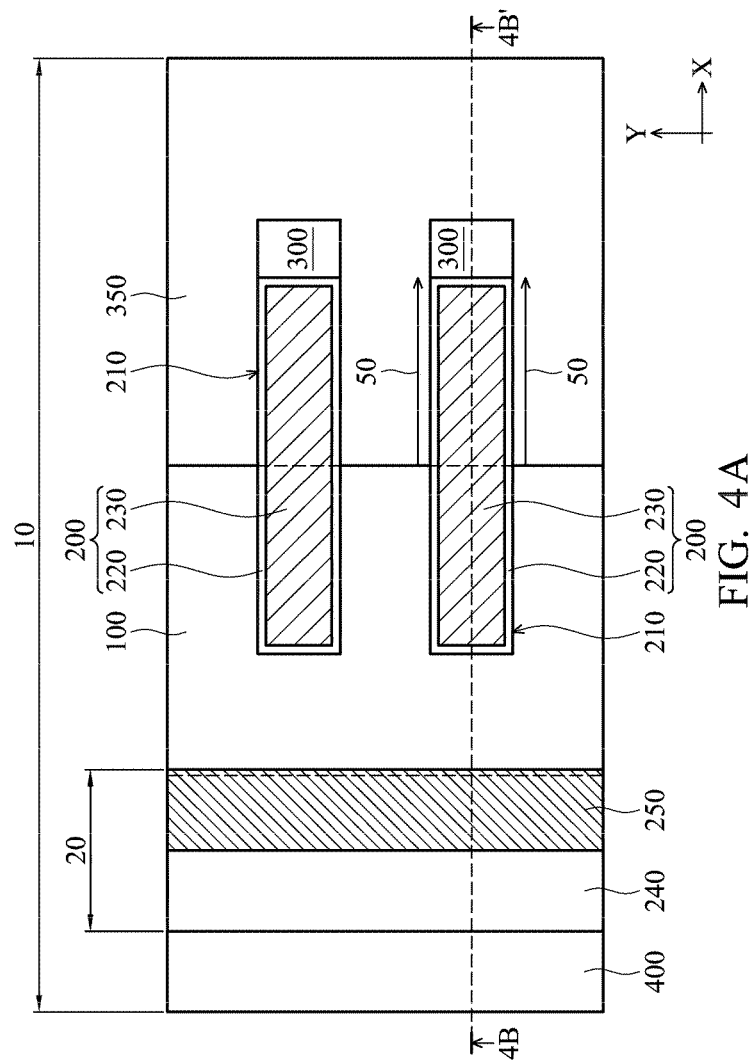
Figure 4B:
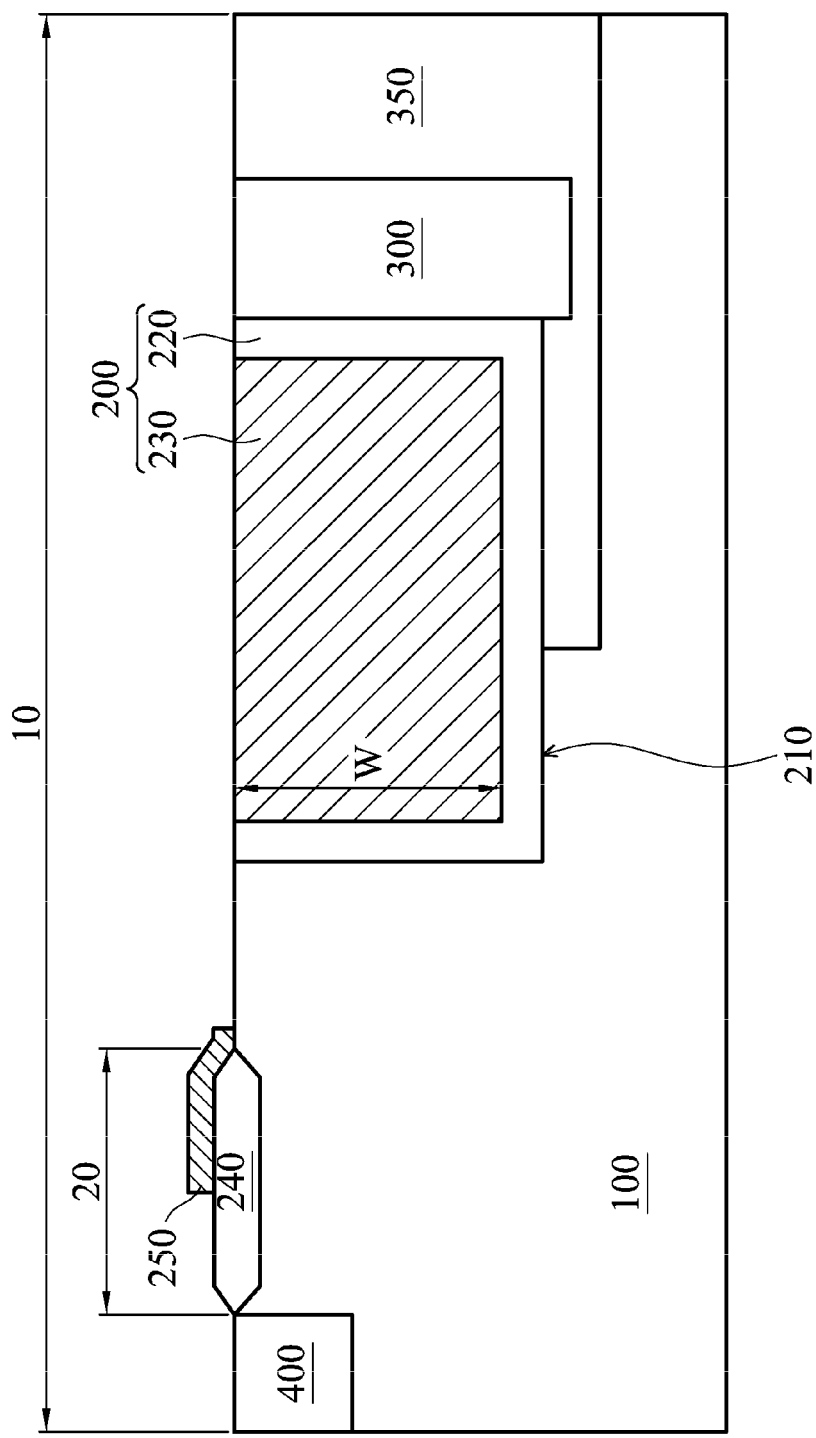
FIG. 4B is a cross-sectional view along the line 4B-4B' in FIG. 4A.

An exemplary embodiment of a semiconductor device having trench-gates according to the invention is illustrated with FIGS. 4A and 4B, wherein FIG. 4A is a top-view of an exemplary embodiment of a semiconductor device according to the invention, and FIG. 4B is a cross-sectional view along the line 4B-4B' in FIG. 4A.

In the embodiment, a semiconductor device having trench-gates comprises a substrate 100, at least one trench-gate structure 200, at least one source doped region 300, a drain doped region 400 and a well region 350. The substrate 100 has an active region 10 and a field-plate region 20 in the active region 10. In the embodiment, the substrate 100 may be a single crystal silicon substrate. In other embodiments, the substrate 100 may be a silicon-on-insulator (SOI) substrate, an epitaxial crystal silicon substrate, a silicon germanium substrate, a compound semiconductor substrate or another suitable semiconductor substrate. In the embodiment, the conductivity type of the substrate 100 is n-type, but it is not limited thereto. In other embodiments, the conductivity type of the substrate 100 is p-type.

Trench-gate structures 200 are disposed in the substrate 100 corresponding to the active region 10. The field-plate region 20 and the well region 350 are at a first side and a second side opposite thereto of the trench-gate structures 200, respectively. In the embodiment, the conductivity type of the well region 350 is p-type, but it is not limited thereto. In other embodiments, the conductivity type of the well region 350 is n-type and may be determined by design demands.

The trench-gate structures 200 comprise a dielectric layer 220 and a gate-electrode layer 230. The dielectric layer 220 is conformally formed in a trench 210 in the substrate 100. The gate-electrode layer 230 is on the dielectric layer 220 and fully fills the trench 210, as shown in FIG. 4B. The dielectric layer 220 is formed as a gate dielectric layer and may comprise oxide, nitride, nitrogen oxide, combinations thereof or another suitable gate dielectric material. The gate-electrode layer 230 may comprise silicon, polysilicon or other electrically conductive materials. In the embodiment, the trench-gate structures 200 are elongated pillars, and the bottom surfaces of the pillars are rounded rectangular, as shown in FIG. 4A. In other embodiments, the bottom surfaces of the pillar of the trench-gate structures 200 may be oval, rectangular or polygonal (not shown).

Source doped regions 300 are disposed in the substrate 100 at the second side of the trench-gate structures 200 and adjoin sidewalls of the trench-gate structures. In the embodiment, the conductivity type of the source doped region 300 is n-type, but it is not limited thereto. In other embodiments, the conductivity type of the source doped region 300 is p-type and may be determined by design demands. For example, the source doped region 300 may comprise p-type dopants, such as boron or boron fluoride, or n-type dopants, such as phosphorous or arsenic.

In the embodiment, the source doped regions 300 have a depth greater than that of the trench-gate structures 200, as shown in FIG. 4B. In other emoluments, the source doped regions 300 may have a depth equal to that of the trench-gate structures 200 (not shown). In the embodiment, as viewed from a top-view perspective, the lengths of the sides of the source doped regions 300 that adjoin the trench-gate structures 200 are equal to the widths of the trench-gate structures 200, as shown in FIG. 4A. In other embodiments, the lengths of the sides of the source doped regions 300 that adjoin the trench-gate structures 200 may be greater than the widths of the trench-gate structures 200 (not shown).

In the embodiment, the semiconductor device having trench-gates may comprise a plurality of trench-gate structures 200 and a plurality of source doped regions 300 correspondingly adjoining the trench-gate structures 200. The trench-gate structures 200 are spaced apart from each other, and the source doped regions 300 are also spaced apart from each other. For example, the semiconductor device having the trench-gates comprises two trench-gate structures 200 spaced apart from each other, and two source doped regions 300 spaced apart from each other and corresponding to the trench-gate structures 200, as shown in FIG. 4A. The trench-gate structures 200 may have the same shape, and the source doped regions 300 may also have the same shape. In another embodiment, the two trench-gate structures 200 may have different shapes, and the source doped regions 300 may have the same shape or different shapes (not shown). In yet another embodiment, the semiconductor device having trench-gates comprises more than two trench-gate structures 200 and more than two source doped regions 300 correspondingly adjoining the trench-gate structures 200. One of the trench-gate structures 200 may have a different shape from that of other trench-gate structures 200 and/or a different pitch between itself and the adjacent trench-gate structure 200 from that between other adjacent trench-gate structures 200. One of the source doped regions 300 may have a different shape from that of the other source doped regions 300 and/or a different pitch between itself and the adjacent source doped regions 300 from that between the other adjacent source doped regions 300. In other embodiments, the trench-gate structures 200 of more than two trench-gate structures 200 may have the same shape or different shapes, and may have the same pitch or different pitches between the adjacent trench-gate structures 200. The source doped regions 300 of more than two source doped regions 300 may have the same shape or different shapes, and may have the same pitch or different pitches between the adjacent source doped regions 300. It is realized that the number and shape of the trench-gate structures 200 and the corresponding source doped regions 300 shown in FIGS. 4A and 4B are used as an example and not limited thereto. The actual number and shape of the trench-gate structures 200 and the corresponding source doped regions 300 are determined by design demands.

A drain doped region 400 is in the substrate 100 corresponding to the active region 10. The trench-gate structures 200 have the same pitch between each trench-gate structure 200 and the drain doped region 400. The drain doped region 400 is at the first side of the trench-gate structures 200 and the field-plate region 20 is between the drain doped region 400 and the trench-gate structures 200, as shown in FIGS. 4A and 4B. In the embodiment, the conductivity type of the drain doped region 400 is p-type, but it is not limited thereto. In other embodiments, the conductivity type of the drain doped region 400 is n-type and may be determined by design demands. For example, the drain doped region 400 may comprise p-type dopants, such as boron or boron fluoride, or n-type dopants, such as phosphorous or arsenic.

In the embodiment, as viewed from a top-view perspective, the extending direction of the length of the trench-gate structure 200 (i.e., X-direction) is substantially perpendicular to that of the drain doped region 400 (i.e., Y-direction), as shown in FIG. 4A.

In the embodiment, the semiconductor device having the trench-gates further comprises a field-oxide layer 240, such as a local oxidation of silicon (LOCOS), and a field electrode 250. The field-oxide layer 240 is in the substrate 100 corresponding to the field-plate region 20 and protrudes from the substrate 100. The field electrode 250 is on the field-oxide layer 240 and extends onto the substrate 100, as shown in FIGS. 4A and 4B.

The driving current of the semiconductor device having the trench-gates passes under the field-oxide layer 240 from the drain doped region 400, and further horizontally flows to the corresponding source doped regions 300 along two opposite sidewalls of the trench-gate structures 200 that are perpendicular to the extending direction of length of the drain doped region 400 (i.e., Y-direction), as indicated by the arrows 50 in FIG. 4A. According to the embodiments, the gate channel width W of the semiconductor device having the trench-gates is equal to the depth of the gate-electrode layer 230 in one trench-gate structure 200. Moreover, since the driving current flows to the source doped regions 300 along two opposite sidewalls of the trench-gate structures 200, the total gate channel width is double the depth of the gate-electrode layer 230 or a sum of the double depths of the gate-electrode layers 230 in the plurality of trench-gate structures 200.

The metal oxide semiconductor field-effect transistor shown in FIG. 1 has only one trench-gate structure 520. The extending direction of length of the trench-gate structure 520 is parallel to that of the drain doped region 510. The gate channel width w of the metal oxide semiconductor field-effect transistor having a trench-gate is the length of the trench-gate structure 520. If the gate channel width w is increased, the area of the semiconductor device will be increased proportionally.

Compared to the metal oxide semiconductor field-effect transistor having a trench-gate shown in FIG. 1, the semiconductor device according to the embodiments has one trench-gate structure 200 or a plurality of trench-gate structures 200 spaced apart from each other. The extending direction of length of the trench-gate structure 200 is substantially perpendicular to that of the drain doped region 400, such that the gate channel width W of the semiconductor device is the depth of the gate-electrode layer 230 in the trench-gate structure 200. Therefore, the desired gate channel width W would be obtained by adjusting the depths of the trench-gate structures 200 and the source doped regions 300.

Accordingly, compared to the trench-gate structure having an extending direction of length parallel to that of the drain doped region, when the device area is fixed, a trench-gate structure is arranged to have an extending direction of length substantially perpendicular to that of the drain doped region, such that the total gate channel width is the double depth of the gate-electrode layer in the trench-gate structure. Therefore, the total gate channel width of the semiconductor device is increased by increasing the depths of the trench-gate structures and the source doped regions. In addition, a plurality of trench-gate structures is capable of being formed spaced apart from each other in the semiconductor device, such that the total gate channel width is increased to the sum of the double depths of the gate-electrode layers in the plurality of trench-gate structures. As a result, the driving current and on-resistance are further improved, and the device area is used more efficiently.

According to the foregoing embodiments, a trench-gate structure has an extending direction of length substantially perpendicular to that of the drain doped region, such that the gate channel width of the semiconductor device is the depth of the gate-electrode layer in the trench-gate structure. Therefore, the total gate channel width of the trench-gate structure can be significantly improved by increasing fewer device area, thereby improving the driving current and on-resistance. Namely, according to the embodiments of the trench-gate structures, the size of the gate structure is decreased and the device area used is increased under the same driving current. Accordingly, the size of the semiconductor device is decreased.

Figure 5A:
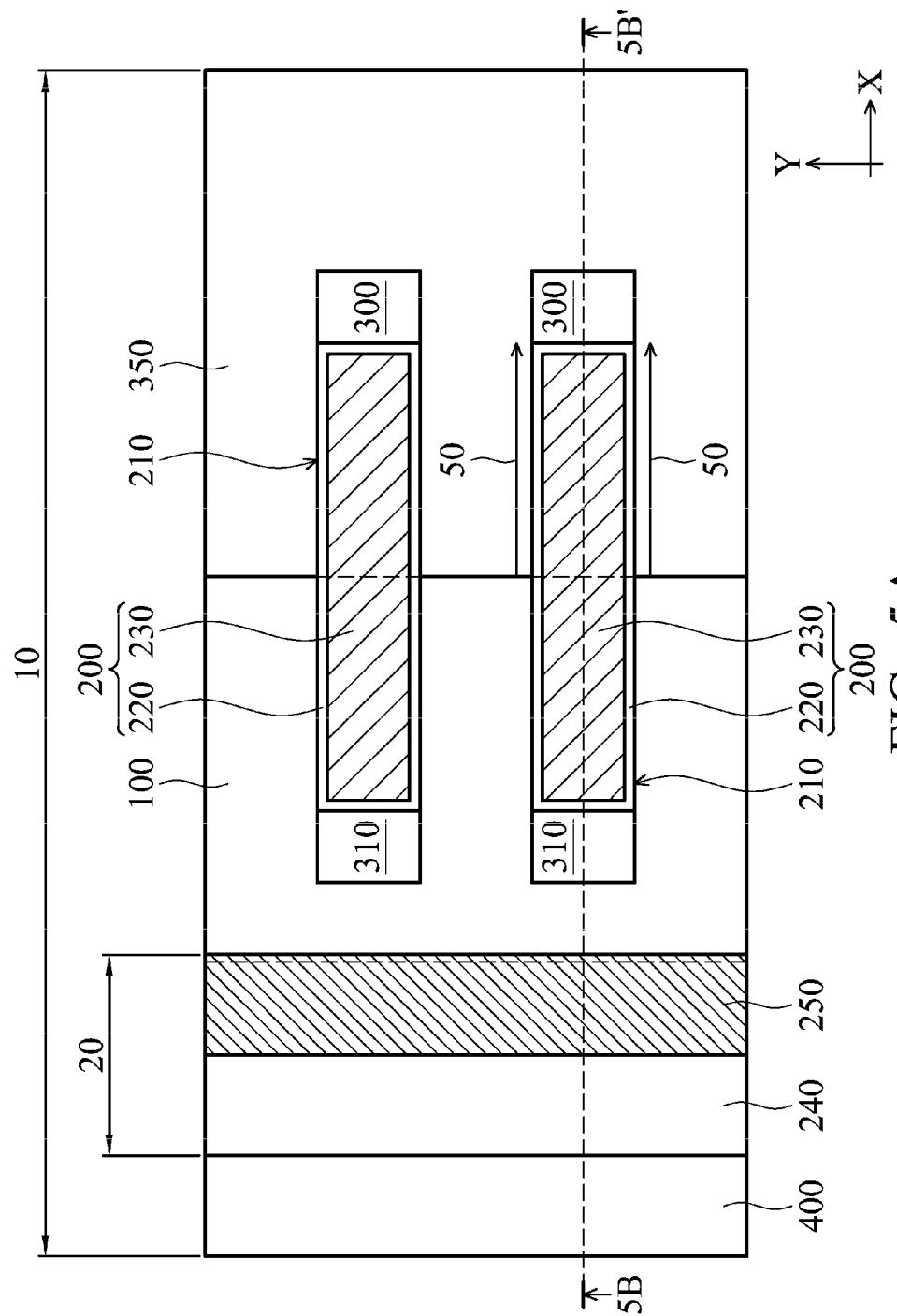
FIG. 5A is a top-view of another exemplary embodiment of a semiconductor device according to the invention.
Figure 5B:
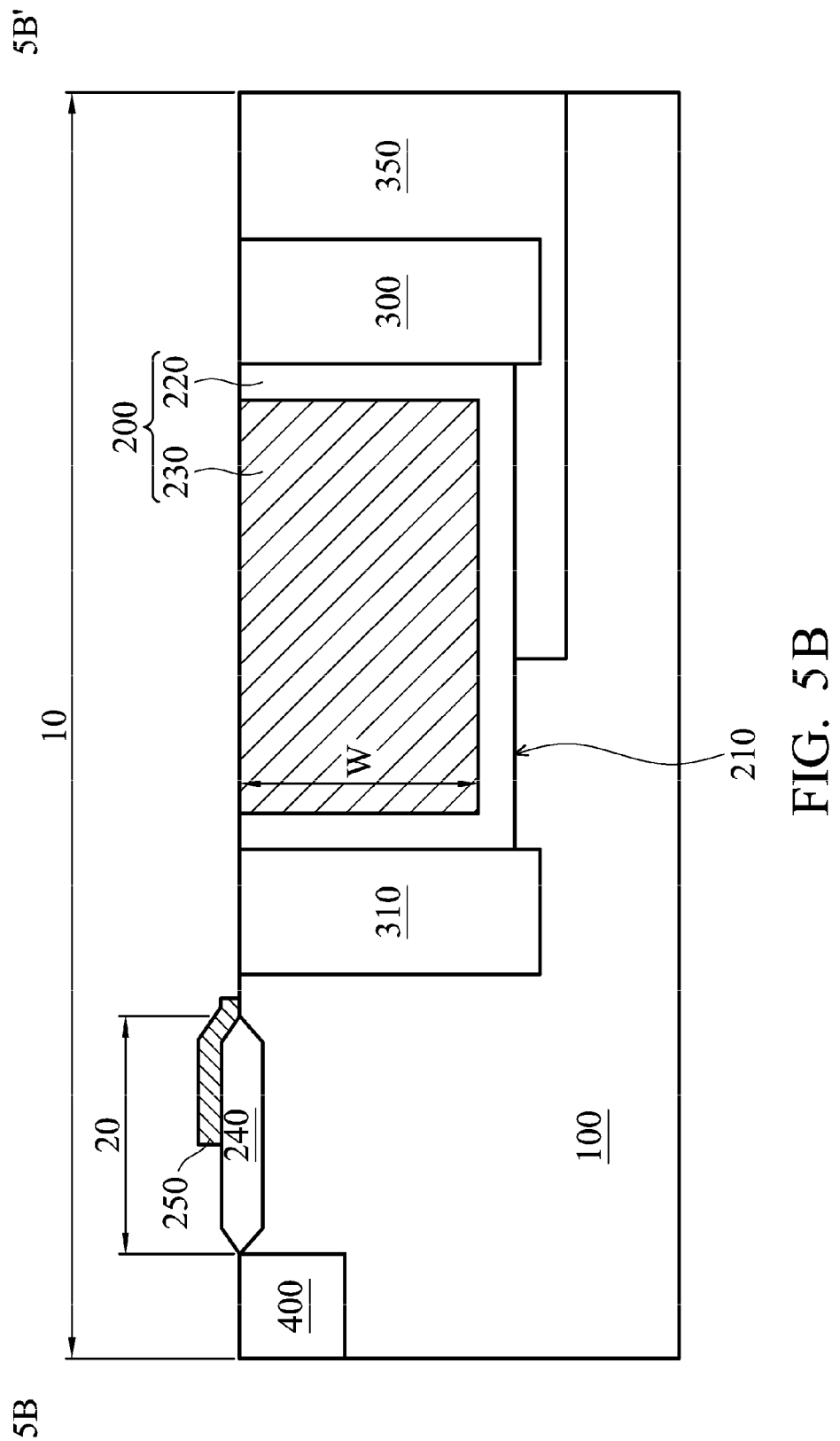
FIG. 5B is a cross-sectional view along the line 5B-5B' in FIG. 5A.

FIG. 5A is a top-view of another exemplary embodiment of a semiconductor device having trench-gates according to the invention, and FIG. 5B is a cross-sectional view along the line 5B-5B' in FIG. 5A. The driving current path and the total gate channel width of the semiconductor device shown in FIGS. 5A and 5B are the same as that of the semiconductor device shown in FIGS. 4A and 4B. Moreover, the semiconductor device structure shown in FIGS. 5A and 5B is similar to that shown in FIGS. 4A and 4B. The difference therebetween is that the semiconductor device shown in FIGS. 5A and 5B further comprises doped regions 310 in the substrate 100 at the first side of the trench-gate structures 200. The doped regions 310 have the same conductivity type as that of the source doped regions 300. Moreover, the doped regions 310 and the source doped regions 300 respectively adjoin two opposite sides of the trench-gate structures 200.

In the embodiment, the source doped regions 300 and the doped regions 310 at the two opposite sides of the trench-gate structures 200 have a depth greater than that of the trench-gate structures 200, as shown in FIG. 5B. In other embodiments, the source doped regions 300 and the doped regions 310 may have a depth equal to that of the trench-gate structures 200 (not shown).

In the embodiment, the semiconductor device having the trench-gates may comprise a plurality of trench-gate structures 200, in which a plurality of source doped regions 300 and a plurality of doped regions 310 correspondingly adjoin the two opposite sidewalls of the trench-gate structures 200. The trench-gate structures 200 are spaced apart from each other. The source doped regions 300 and the doped regions 310 at the two opposite sides of the trench-gate structures 200 are also spaced apart from each other, respectively. For example, the semiconductor device having the trench-gates comprises two trench-gate structures 200 spaced apart from each other, and two source doped regions 300 and two doped regions 310 corresponding to the two opposite sidewalls of the two trench-gate structures 200, as shown in FIG. 5A.

According to an embodiment, since the source doped regions 300 and the doped regions 310 having the same conductivity type as that of the source doped regions 300 are respectively at the two opposite sides of the trench-gate structures 200, the electric current flows through the doped regions 310 to the source doped regions 300 along the sidewalls of the trench-gate structures 200. Accordingly, the resistance of the electric current path would be further reduced, thereby improving the driving current of the semiconductor device.

Figure 2A:
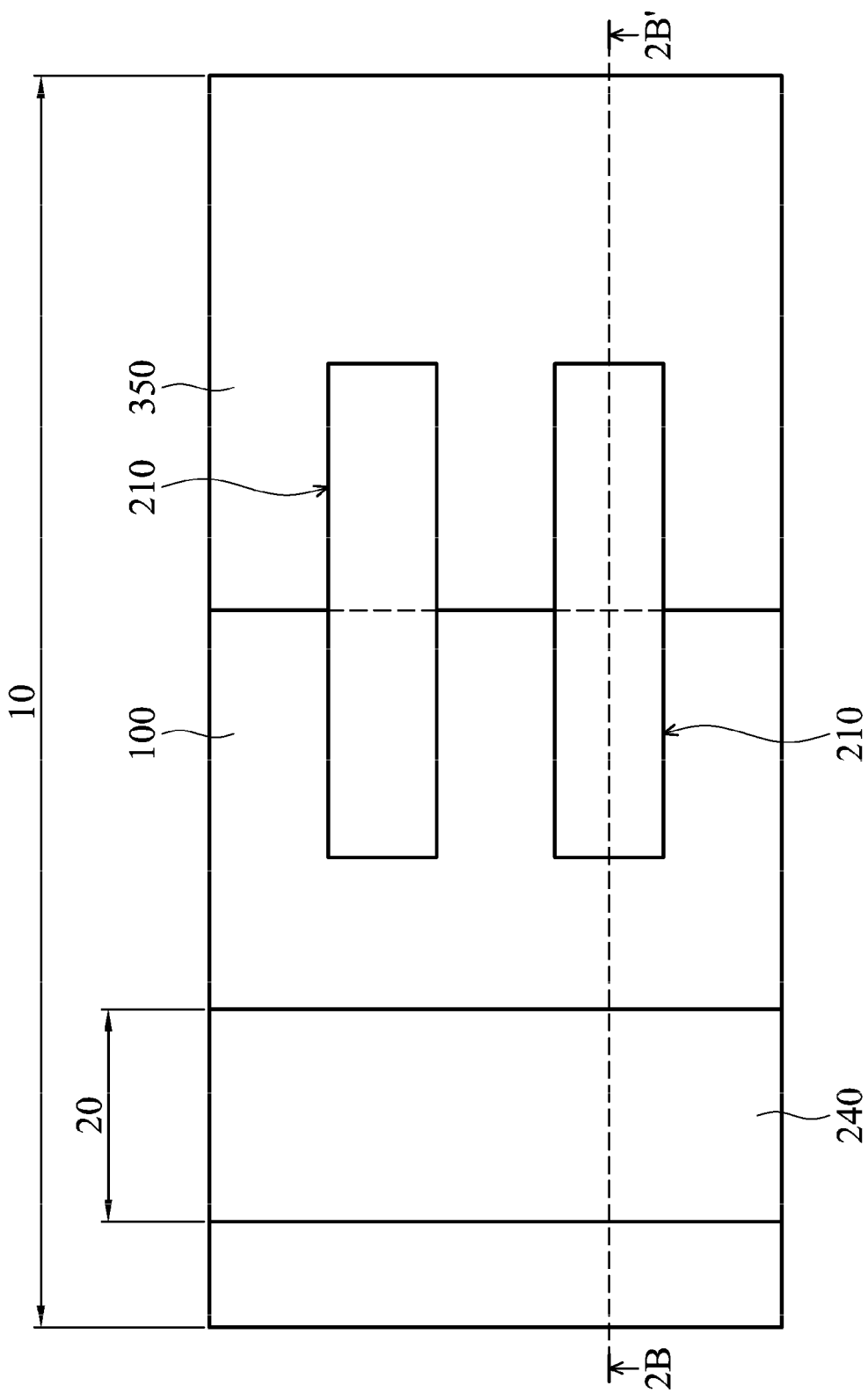
FIGS. 2A, 3A and 4A are top-views of an exemplary embodiment of a method for forming a semiconductor device according to the invention.
Figure 2B:
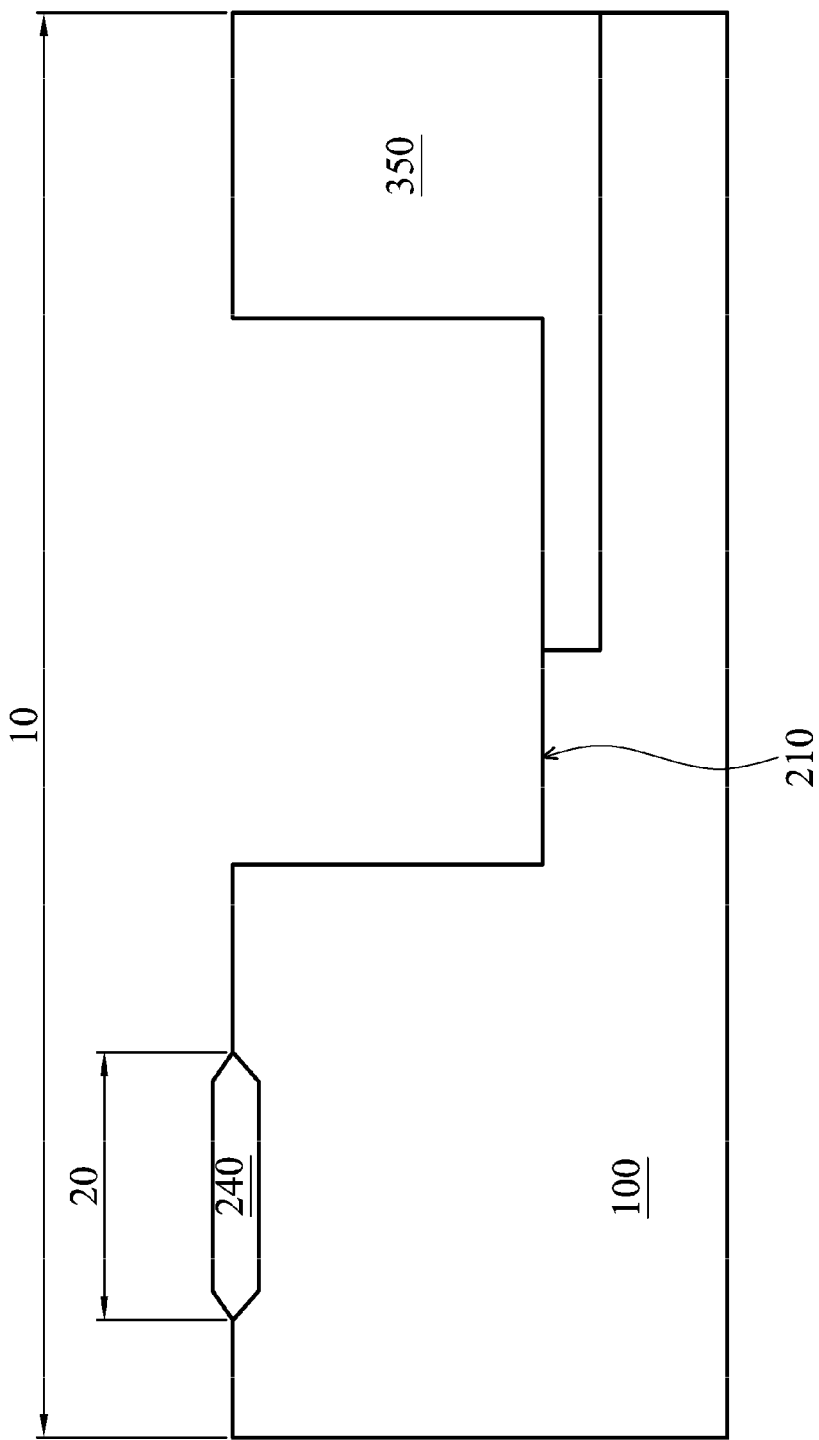
FIG. 2B is a cross-sectional view along the line 2B-2B' in FIG. 2A.
Figure 3A:
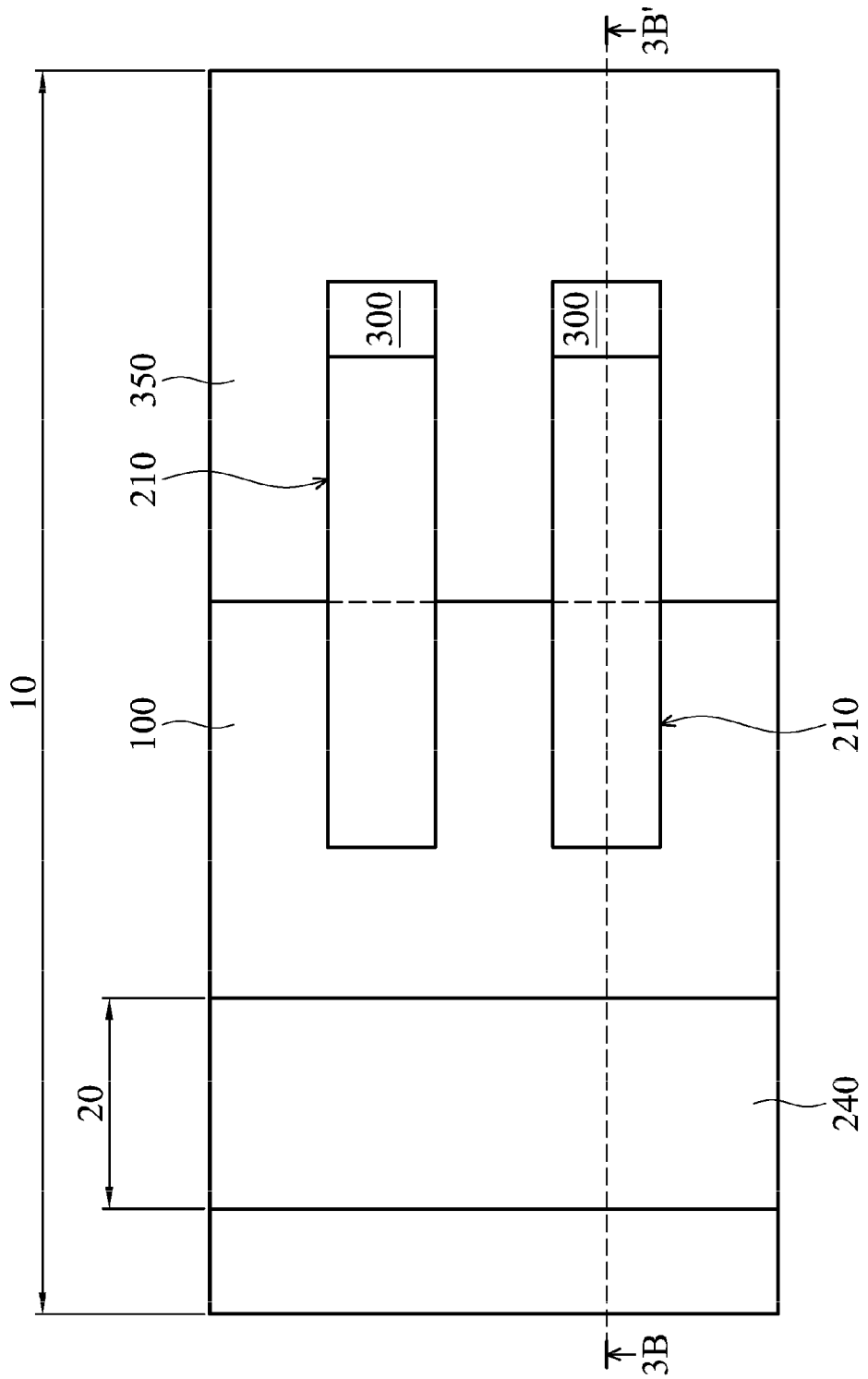
Figure 3B:
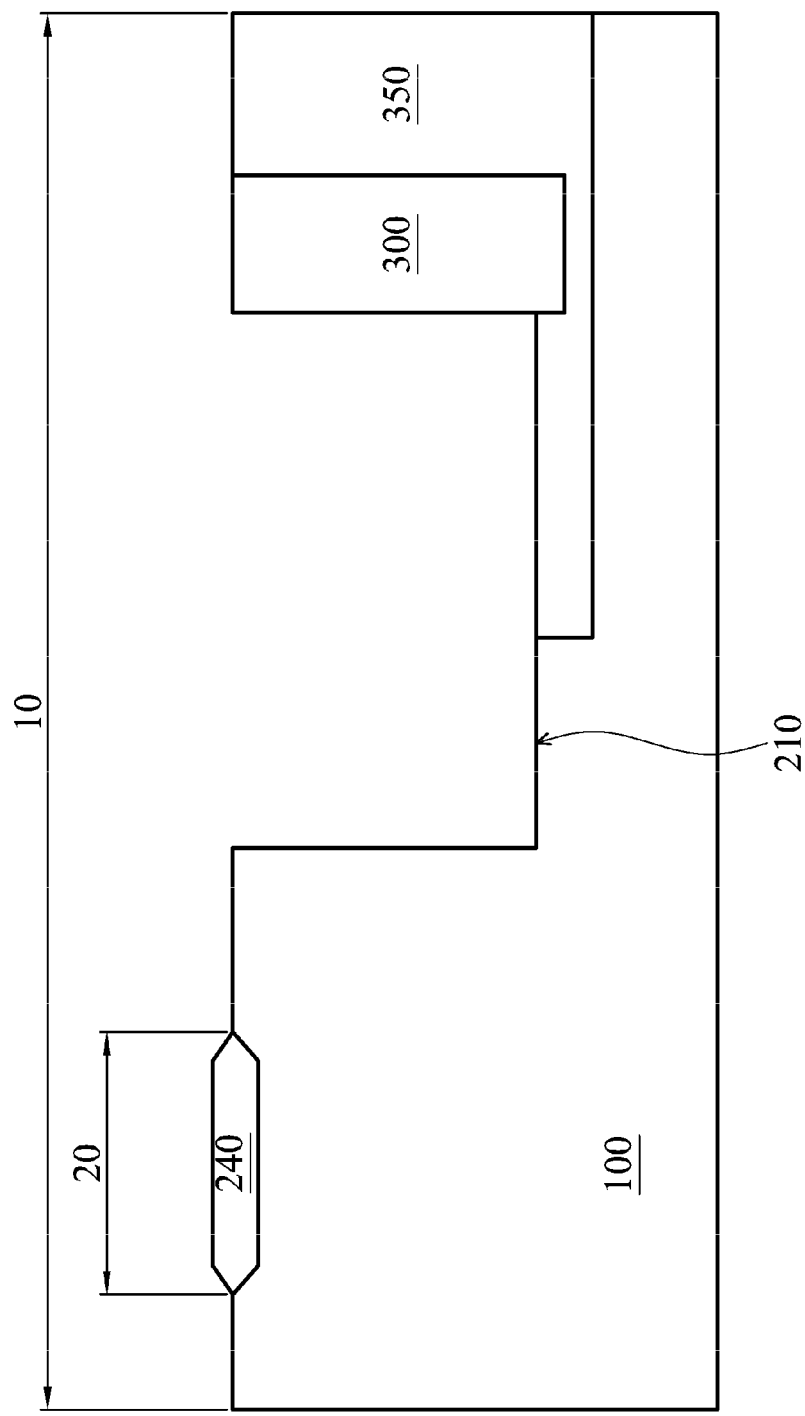
FIG. 3B is a cross-sectional view along the line 3B-3B' in FIG. 3A.

An exemplary embodiment of a method for forming a semiconductor device having trench-gates according to the invention is illustrated with FIGS. 2A, 2B, 3A, 3B, 4A and 4B, wherein FIGS. 2A, 3A and 4A are top-views of an exemplary embodiment of a method for forming a semiconductor device having trench-gates according to the invention. FIG. 2B is a cross-sectional view along the line 2B-2B' in FIG. 2A. FIG. 3B is a cross-sectional view along the line 3B-3B' in FIG. 3A, and FIG. 4B is a cross-sectional view along the line 4B-4B' in FIG. 4A.

Referring to FIGS. 2A and 2B, a substrate 100 having an active region 10 is provided. A field-plate region 20 is in the active region 10. In the embodiment, the substrate 100 may be a single crystal silicon substrate. In other embodiments, the substrate 100 may be a silicon-on-insulator (SOI) substrate, an epitaxial crystal silicon substrate, a silicon germanium substrate, a compound semiconductor substrate or another suitable semiconductor substrate. In the embodiment, the conductivity type of the substrate 100 is n-type, but it is not limited thereto. In other embodiments, the conductivity type of the substrate 100 is p-type and may be determined by design demands.

A well region 350 may be formed in the substrate 100 by a doping process, such as an ion implantation process. In the embodiment, the conductivity type of the well region 350 is p-type, but it is not limited thereto. In other embodiments, the conductivity type of the well region 350 is n-type and may be determined by design demands.

Next, a patterned hard mask (not shown), such as a silicon nitride layer, may be formed on the substrate 100 by deposition, lithography and etching processes to expose the substrate 100 corresponding to the field-plate region 20. Next, a field-oxide layer 240, such as a local oxidation of silicon (LOCOS), is formed in the substrate 100 corresponding to the field-plate region 20 and protrudes from the substrate 100 by an oxide growth process.

After the hard mask is removed, another patterned hard mask (not shown) may be formed on the substrate 1000 by deposition, lithography and etching processes to expose a portion of the substrate 100. Next, an etching process, such as a dry etching process, a wet etching process, a plasma etching process, a reactive ion etching (RIE) process or another suitable etching process, is performed to form at least one trench 210 in the substrate 100. A portion of the trench 210 is in the well region 350, and the field-plate region 20 and the well region 350 are at a first side and a second side opposite thereto of the trench 210, respectively. For example, two trenches 210 are formed in the substrate 100, as shown in FIG. 2A.

Next, referring to FIGS. 3A and 3B, after the hard mask (not shown) configured to form the trenches 210 is removed, a plurality of source doped regions 300 may be formed in the substrate 100 at the second side of the trenches 210 by a doping process, such as an ion implantation process. The source doped regions 300 correspond to the trenches 210 and are spaced apart from each other. In the embodiment, the conductivity type of the source doped region 300 is n-type, but it is not limited thereto. In other embodiments, the conductivity type of the source doped region 300 is p-type and may be determined by design demands. For example, the source doped region 300 may comprise p-type dopants, such as boron or boron fluoride, n-type dopants, such as phosphorous or arsenic, and/or combinations thereof.

In the embodiment, the two source doped regions 300 may have the same shape, as shown in FIG. 3A. In another embodiment, the two source doped regions 300 may have different shapes (not shown). In yet another embodiment, the semiconductor device having trench-gates comprises more than two source doped regions 300. One of the source doped regions 300 may have a different shape from that of the other source doped regions 300 and/or a different pitch between itself and the adjacent source doped regions 300 from that between the other adjacent source doped regions 300. In other embodiments, the source doped regions 300 of more than two source doped regions 300 may have the same shape or different shapes, and may have the same pitch or different pitches between the adjacent source doped regions 300. It is realized that the number and shape of the source doped regions 300 shown in FIG. 3A are used as an example and are not meant to be limiting. The actual number and shape of the source doped regions 300 are determined by design demands.

In another embodiment, the source doped regions 300 and doped regions 310 having the same conductivity type as that of the source doped regions 300 may be formed in the substrate 100 at the two opposite sides of the trenches 210 by a doping process, as shown in FIGS. 5A and 5B. The doped regions 310 and the source doped regions 300 adjoin two opposite sidewalls of the trenches 210, respectively.

Referring to FIGS. 4A and 4B, a dielectric material may be conformally deposited in each trench 210 by a deposition process, such as an atomic layer deposition (ALD), a chemical vapor deposition (CVD), a physical vapor deposition (PVD), a thermal oxide process or another suitable process, to correspondingly form a dielectric layer 220 as a gate dielectric layer. The dielectric layer 220 may comprise oxide, nitride, nitrogen oxide, a combination thereof, or another suitable gate dielectric material.

Next, a conductive material may be deposited on the dielectric layer 220 and fully fill the corresponding trench 210 by a deposition process, such as physical vapor deposition, chemical vapor deposition, atomic layer deposition, a sputter process or a coating process, to form a gate-electrode layer 230. Therefore, two trench-gate structures 200 spaced apart from each other are formed in the substrate 100, as shown in FIG. 4A. The field-plate region 20 and the well region 350 are at a first side and a second side opposite thereto of the trench-gate structures 200, respectively. The source doped regions 300 are in the substrate 100 at the second side of the trench-gate structures 200 and one source doped region 300 correspondingly adjoins the sidewall of one trench-gate structure 200.

The gate-electrode layer 230 may comprise silicon, polysilicon or another electrically conductive material. In addition, a field electrode 250 may be formed on the field-oxide layer 240 and extend onto the substrate 100 by a deposition process.

In the embodiment, each of the two trench-gate structures 200 is an elongated pillar, and the bottom surface of the pillar is rounded rectangular, as shown in FIG. 4A. In another embodiment, the two trench-gate structures 200 may have different shapes (not shown). In yet another embodiment, the semiconductor device having trench-gates comprises more than two trench-gate structures 200. One of the trench-gate structures 200 may have a different shape from that of the other trench-gate structures 200 and/or a different pitch between itself and the adjacent trench-gate structure 200 from that between the other adjacent trench-gate structures 200. In other embodiments, the bottom surfaces of the pillars of the trench-gate structures 200 may be oval, rectangular or polygonal (not shown). More than two trench-gate structures 200 may have the same shape or different shapes, and may have the same pitch or different pitches between the adjacent trench-gate structures 200. It is realized that the number and shape of the trench-gate structures 200 shown in FIG. 4A are used as an example and are not meant to be limiting. The actual number and shape of the trench-gate structures 200 are determined by design demands.

In the embodiment, the source doped regions 300 have a depth greater than that of the trench-gate structures 200, as shown in FIG. 4B. In other embodiments, the source doped regions 300 may have a depth equal to that of the trench-gate structures 200 (not shown). In the embodiment, as viewed from a top-view perspective, the lengths of the sides of the source doped regions 300 that adjoin the trench-gate structures 200 are equal to the widths of the trench-gate structures 200, as shown in FIG. 4A. In other embodiments, the lengths of the sides of the source doped regions 300 that adjoin the trench-gate structures 200 may be greater than the widths of the trench-gate structures 200 (not shown).

Next, a drain doped region 400 may be formed in the substrate 100 corresponding to the active region 10 by a doping process, such as an ion implantation process. The field-plate region 20 is between the drain doped region 400 and the trench-gate structures 200, and the trench-gate structures 200 have the same pitch between each trench-gate structure 200 and the drain doped region 400. In the embodiment, the conductivity type of the drain doped region 400 is p-type, but it is not limited thereto. In other embodiments, the conductivity type of the drain doped region 400 is n-type and may be determined by design demands. For example, the drain doped region 400 may comprise p-type dopants, such as boron or boron fluoride, n-type dopants, such as phosphorous or arsenic and/or combinations thereof.

In the embodiment, as viewed from a top-view perspective, an extending direction of length of the trench-gate structure 200 (i.e., the X-direction) is substantially perpendicular to that of the drain doped region 400 (i.e., the Y-direction), as shown in FIG. 4A.

The driving current of the semiconductor device having the trench-gates passes under the field-oxide layer 240 from the drain doped region 400, and further horizontally flows to the corresponding source doped regions 300 along two opposite sidewalls of the trench-gate structures 200 that are perpendicular to the extending direction of length of the drain doped region 400 (i.e., Y-direction), as indicated by the arrows 50 in FIG. 4A. According to the embodiments, the gate channel width W of the semiconductor device having the trench-gates is equal to the depth of the gate-electrode layer 230 in one trench-gate structure 200. Moreover, since the driving current flows to the source doped regions 300 along two opposite sidewalls of the trench-gate structures 200, the total gate channel width is double the depth of the gate-electrode layer 230 or a sum of double the depths of the gate-electrode layers 230 in the plurality of trench-gate structures 200.

Compared to the trench-gate structure having an extending direction of length parallel to that of the drain doped region, according to the foregoing embodiments, a trench-gate structure is arranged to have an extending direction of length substantially perpendicular to that of the drain doped region, such that the total gate channel width is double the depth of the gate-electrode layer in the trench-gate structure. As a result, the size of the gate structure is decreased and the device area used is increased under the same driving current. Accordingly, the size of the semiconductor device is decreased.

The embodiments of a semiconductor device and a method for forming the same can be implemented to a laterally diffused metal oxide semiconductor (LDMOS), an N-channel insulated gate bipolar transistor (NIGBT) and various low-voltage, high-voltage and ultra-high voltage elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having an active region and a field-plate region in the active region;
   a field electrode on the substrate in the field-plate region;
   at least one trench-gate structure in the substrate, wherein the field-plate region is at a first side of the at least one trench-gate structure;
   at least one source doped region in the substrate at a second side opposite to the first side of the at least one trench-gate structure, wherein the at least one source doped region adjoins a sidewall of the at least one trench-gate structure, and the at least one source doped region has a length that is equal to a width of the at least one trench-gate structure as viewed from a top-view perspective;
   a well region in the substrate at the second side of the at least one trench-gate structure, wherein the well region adjoins a top portion of the at least one trench-gate structure and adjoins the at least one source doped region at the second side; and
   a drain doped region in the substrate corresponding to the active region, wherein the field-plate region is between the drain doped region and the at least one trench-gate structure, and wherein an extending direction of a length of the at least one trench-gate structure is perpendicular to that of the drain doped region and is perpendicular to that of the field electrode as viewed from the top-view perspective.

2. The semiconductor device as claimed in claim 1, wherein the at least one source doped region has a depth equal to or greater than that of the at least one trench-gate structure.

3. The semiconductor device as claimed in claim 1, wherein a gate channel width of the semiconductor device is a depth of a gate-electrode layer in the at least one trench-gate structure.

4. The semiconductor device as claimed in claim 1, wherein the at least one trench-gate structure is an elongated pillar, and a bottom surface of the pillar is oval, rounded rectangular, rectangular or polygonal.

5. The semiconductor device as claimed in claim 1, wherein the semiconductor device comprises a plurality of trench-gate structures and a plurality of corresponding source doped regions, and wherein the plurality of trench-gate structures is spaced apart from each other, and the plurality of source doped regions is spaced apart from each other.

6. The semiconductor device as claimed in claim 5, wherein the plurality of trench-gate structures has the same pitch between each other, and has the same pitch between each trench-gate structure and the drain doped region, and wherein the plurality of source doped regions has the same pitch between each other.

7. The semiconductor device as claimed in claim 5, wherein the plurality of trench-gate structures has different pitches between each other, and has the same pitch between each trench-gate structure and the drain doped region, and wherein the plurality of source doped regions has different pitches between each other.

8. The semiconductor device as claimed in claim 5, wherein the plurality of trench-gate structures has the same shape.

9. The semiconductor device as claimed in claim 5, wherein at least one of the plurality of trench-gate structures has a different shape from that of the other trench-gate structures.

10. The semiconductor device as claimed in claim 1, wherein the at least one trench-gate structure comprises:
    a dielectric layer conformally disposed in a trench in the substrate; and
    a gate-electrode layer on the dielectric layer and fully filling the trench.

11. The semiconductor device as claimed in claim 1, further comprising:
    a field-oxide layer on the substrate corresponding to the field-plate region, wherein the field electrode is disposed on the field-oxide layer.

12. The semiconductor device as claimed in claim 1, wherein the semiconductor device further comprises at least one doped region in the substrate at the first side of the at least one trench-gate structure, and wherein the at least one doped region has the same conductivity type as that of the at least one source doped region.

13. A method for forming a semiconductor device, comprising: providing a substrate having an active region and a field-plate region in the active region; forming a field electrode on the substrate in the field-plate region;
  forming at least one trench-gate structure in the substrate, wherein the field-plate region is at a first side of the at least one trench-gate structure;
  forming at least one source doped region in the substrate at a second side opposite to the first side of the at least one trench-gate structure, wherein the at least one source doped region adjoins a sidewall of the at least one trench-gate structure, and the at least one source doped region has a length that is equal to a width of the at least one trench-gate structure as viewed from a top-view perspective;
  forming a well region in the substrate at the second side of the at least one trench-gate structure, wherein the well region adjoins a top portion of the at least one trench-gate structure and adjoins the at least one source doped region at the second side; and
  forming a drain doped region in the substrate corresponding to the active region, wherein the field-plate region is between the drain doped region and the at least one trench-gate structure, and wherein an extending direction of a length of the at least one trench-gate structure is perpendicular to that of the drain doped region and is perpendicular to that of the field electrode as viewed from the top-view perspective.

14. The method as claimed in claim 13, wherein the at least one source doped region has a depth equal to or greater than that of the at least one trench-gate structure.

15. The method as claimed in claim 13, wherein a gate channel width of the semiconductor device is a depth of a gate-electrode layer in the at least one trench-gate structure.

16. The method as claimed in claim 13, wherein the at least one trench-gate structure is an elongated pillar, and a bottom surface of the pillar is oval, rounded rectangular, rectangular or polygonal.

17. The method as claimed in claim 13, wherein the semiconductor device comprises a plurality of trench-gate structures and a plurality of corresponding source doped regions, and wherein the plurality of trench-gate structures is spaced apart from each other, and the plurality of source doped regions is spaced apart from each other.

18. The method as claimed in claim 17, wherein the plurality of trench-gate structures has the same pitch between each other, and has the same pitch between each trench-gate structure and the drain doped region, and wherein the plurality of source doped regions has the same pitch between each other.

19. The method as claimed in claim 17, wherein the plurality of trench-gate structures has different pitches between each other, and has the same pitch between each trench-gate structure and the drain doped region, and wherein the plurality of source doped regions has different pitches between each other.

20. The method as claimed in claim 17, wherein the plurality of trench-gate structures has the same shape.

21. The method as claimed in claim 17, wherein at least one of the plurality of trench-gate structures has a different shape from that of the other trench-gate structures.

22. The method as claimed in claim 13, further comprising:
  forming a field-oxide layer on the substrate corresponding to the field-plate region, wherein the field electrode is disposed on the field-oxide layer.

23. The method as claimed in claim 13, further comprising forming at least one doped region in the substrate at the first side of the at least one trench-gate structure, wherein the at least one doped region has the same conductivity type as that of the at least one source doped region.

24. The semiconductor device as claimed in claim 1, further comprising a second source doped region in the substrate at the first side of the at least one trench-gate structure, wherein the second source doped region adjoins a second sidewall of the at least one trench-gate structure.

25. The semiconductor device as claimed in claim 24, wherein the second source doped region is separated from the at least one source doped region and the well region.

* * * * *